United States Patent
Ning et al.

(10) Patent No.: US 9,817,927 B2
(45) Date of Patent: Nov. 14, 2017

(54) HARD MASK ETCH AND DIELECTRIC ETCH AWARE OVERLAP FOR VIA AND METAL LAYERS

(71) Applicant: GLOBALFOUNDRIES Inc., Grand Cayman (KY)

(72) Inventors: Guo Xiang Ning, Ballston Lake, NY (US); Yuping Ren, Clifton Park, NY (US); David Power, Malta, NY (US); Lalit Shokeen, Clifton Park, NY (US); Chin Teong Lim, Clifton Park, NY (US); Paul W. Ackmann, Gansevoort, NY (US); Xiang Hu, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 288 days.

(21) Appl. No.: 14/841,037

(22) Filed: Aug. 31, 2015

(65) Prior Publication Data

US 2017/0061044 A1     Mar. 2, 2017

(51) Int. Cl.
*G06F 17/50* (2006.01)
*G03F 1/36* (2012.01)

(52) U.S. Cl.
CPC ............ *G06F 17/5009* (2013.01); *G03F 1/36* (2013.01); *G06F 17/5081* (2013.01)

(58) Field of Classification Search
None
See application file for complete search history.

(56) References Cited

U.S. PATENT DOCUMENTS

2002/0063110 A1* 5/2002 Cantell ............ H01L 21/28123
                                                                216/51
2008/0160646 A1* 7/2008 White ................ G06F 17/5009
                                                                438/5

FOREIGN PATENT DOCUMENTS

JP      2014520403 A      8/2014
TW      201351030 A      12/2013
WO     2014209327 A1    12/2014

OTHER PUBLICATIONS

Taiwanese Office Action for related Taiwanese Patent Application No. 105127858 dated Jun. 21, 2017, 5 Pages.

* cited by examiner

*Primary Examiner* — Dennis M Butler
(74) *Attorney, Agent, or Firm* — Ditthavong & Steiner, P.C.

(57) ABSTRACT

A method and apparatus for generating a final dielectric etch compensation table and a final hard mask etch compensation table for either OPC or MPC process flows are provided. Embodiments include performing an overlap pattern classification on a wafer; calibrating a dielectric etch bias or a hard mask etch bias based on the pattern classification; comparing either a CD overlap of a via layer with a metal layer and a CD overlap of the via layer with a lower connecting metal layer or a CD overlap of the metal layer with an upper connecting via layer and a CD overlap of the metal layer with the via layer against a criteria; outputting final dielectric etch compensation and hard mask etch compensation tables to either OPC or MPC process flows; and repeating the steps of calibrating, comparing, and outputting for either the via layer or metal layer remaining.

20 Claims, 6 Drawing Sheets

HARD MASK ETCH AND DIELECTRIC ETCH AWARE OVERLAP FOR VIA AND METAL LAYERS

TECHNICAL FIELD

The present disclosure relates to etch modeling for semiconductor devices. The present disclosure is particularly applicable to the formation of vias in semiconductor devices.

BACKGROUND

Lithography and optical proximity correction (OPC) contours cannot accurately predict the hard mask contour of a metal layer (Mx). Lithography and OPC contours also cannot accurately predict the dielectric etch of a via layer (Vx). Therefore, it is difficult to accurately predict the overlap between Mx+1 and Vx layers, e.g., V0, M1, V1, M2, V2, and M3, especially for the back-end-of-line with the self-aligned via in a trench first via last process. FIG. 1 schematically illustrates a background layering of Mx+1 and Vx layers. For example, a Vx layer 101, e.g., V0, may be formed between the contact layer 103 and Mx+1 layer 105, e.g., M1. Next, a Vx+1 layer 107, e.g., V1, may be formed between the Mx+1 layer 105 and the Mx+2 layer 109, e.g., M1 and M2, respectively. Thereafter, a Vx+2 layer 111, e.g., V2, may be formed between the Mx+2 layer 109 and the Mx+3 layer 113, e.g., M2 and M3, respectively.

Currently, there is a gap or bias between the assumed trench CD 201 and the actual trench CD 203 after the hard mask open process, as depicted in FIG. 2A. There is also a gap or bias between the assumed via CD 205 and the actual via CD 207, as depicted in FIG. 2B. Consequently, the actual overlap of the connecting via 207 and the actual trench 203 as depicted by the line 209 is much less than the assumed overlap of the assumed via 205 and the assumed trench 201 as depicted by the line 211.

A need therefore exists for methodology enabling bias compensation to maximize the connection area between metal and connecting via layers.

SUMMARY

An aspect of the present disclosure is a method of generating a final dielectric etch compensation table for a Vx layer and a hard mask etch compensation table for a Mx+1 layer for either an OPC process flow or a mask process correction (MPC) process flow.

Another aspect of the present disclosure is an apparatus that generates a final dielectric etch compensation table for a Vx layer and a hard mask etch compensation table for a Mx+1 layer for either an OPC process flow or a MPC process flow.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: performing an overlap pattern classification on a wafer; calibrating either a dielectric etch bias or a hard mask etch bias based on the pattern classification; comparing either a top CD overlap of a via layer with an upper connecting metal layer and a bottom CD overlap of the via layer with a lower connecting metal layer or a top CD overlap of the upper connecting metal layer with an upper connecting via layer and a bottom CD overlap of the upper connecting metal layer with the via layer against a criteria based on the calibration; outputting a final dielectric etch compensation table for the via layer or a final hard mask etch compensation table for the upper connecting metal layer to either an OPC process flow or a MPC process flow based on the comparison; and repeating the steps of calibrating, comparing, and outputting for either the via layer or the upper connecting metal layer remaining.

Aspects of the present disclosure include performing the steps of comparing the top CD overlap of the via layer with the upper connecting metal layer and the bottom CD overlap of the via layer with the lower connecting metal layer and the top CD overlap of the upper connecting metal layer with the upper connecting via layer and the bottom CD overlap of the upper connecting metal layer with the via layer against the criteria in relation to one another. Other aspects include calibrating the dielectric etch bias or the hard mask etch bias further based on a default dielectric etch compensation table and a dielectric etch bias Delta CD and a default hard mask etch compensation table and a hard mask etch bias Delta CD, respectively. Further aspects include determining whether available space on the wafer is such that a bridging limit is not violated if the top CD overlap of the via layer with the upper connecting metal layer and the bottom CD overlap of the via layer with the lower connecting metal layer or if the top CD overlap of the upper connecting metal layer with the upper connecting via layer and the bottom CD overlap of the upper connecting metal layer with the via layer are not within the criteria. Additional aspects include outputting the final dielectric etch compensation table or the final hard mask compensation table, respectively, if the top CD overlap of the via layer with the upper connecting metal layer and the bottom CD overlap of the via layer with the lower connecting metal layer are within the criteria, if the top CD overlap of the upper connecting metal layer with the upper connecting via layer and the bottom CD overlap of the upper connecting metal layer with the via layer are within the criteria, or if the available space on the wafer is such that the bridging limit is violated. Another aspect includes, if the top CD overlap of the via layer with the upper connecting metal layer and the bottom CD overlap of the via layer with the lower connecting metal layer are not within the criteria and if the available space on the wafer is such that the bridging limit is not violated, adjusting the dielectric etch bias; updating the dielectric etch bias Delta CD based on the adjustment; and repeating the step of comparing the top CD overlap of the via layer with the upper connecting metal layer and the bottom CD overlap of the via layer with the lower connecting metal layer until the top CD overlap of the via layer with the upper connecting metal layer and the bottom CD overlap of the via layer with the lower connecting metal layer are within the criteria.

Other aspects include if the top CD overlap of the upper connecting metal layer with the upper connecting via layer and the bottom CD overlap of the upper connecting metal layer with the via layer are within the criteria and if the available space on the wafer is such that the bridging limit is not violated, adjusting the hard mask etch bias; updating the hard mask etch bias Delta CD based on the adjustment; and repeating the step of comparing the top CD overlap of the upper connecting metal layer with the upper connecting via layer and the bottom CD overlap of the upper connecting metal layer with the via layer until the top CD overlap of the upper connecting metal layer with the upper connecting via layer and the bottom CD overlap of the upper connecting metal layer with the via layer are within the criteria. Further aspects include, if the final dielectric etch compensation table for the via layer and the final hard mask etch compensation table for the upper connecting metal layer are outputted to the OPC process flow, performing OPC on the final dielectric etch compensation table and the hard mask etch compensation table; generating graphic data system out (GDSout) files based on the OPC; and sending the GDSout files to a mask house for reticle processing. Additional aspects include, if the final dielectric etch compensation table for the via layer and the final hard mask etch compensation table for the metal layer are outputted to the MPC process flow, generating GDSout files after OPC based on the final dielectric etch compensation table and the hard mask etch compensation table; finalizing the generated GDSout files; and sending the GDSout files to either an outside mask house or an internal mask house for reticle processing.

Another aspect of the present disclosure is an apparatus including: a processor; and a memory including computer program code for one or more programs, the memory and the computer program code configured to, with the processor, cause the apparatus to perform the following, perform an overlap pattern classification on a wafer; calibrate either a dielectric etch bias or a hard mask etch bias based on the pattern classification; compare either a top CD overlap of a via layer with an upper connecting metal layer and a bottom CD overlap of the via layer with a lower connecting metal layer or a top CD overlap of the upper connecting metal layer with an upper connecting via layer and a bottom CD overlap of the upper connecting metal layer with the via layer against a criteria based on the calibration; output a final dielectric etch compensation table for the via layer or a final hard mask etch compensation table for the upper connecting metal layer to either an OPC process flow or a MPC process flow based on the comparison; and repeat the steps of calibrate, compare, and output for either the via layer or the upper connecting metal layer remaining.

Aspects of the apparatus include the apparatus being further caused to: perform the steps of comparing the top CD overlap of the via layer with the upper connecting metal layer and the bottom CD overlap of the via layer with the lower connecting metal layer and the top CD overlap of the upper connecting metal layer with the upper connecting via layer and the bottom CD overlap of the upper connecting metal layer with the via layer against the criteria in relation to one another. Others aspects include the apparatus being further caused to: calibrate the dielectric etch bias or the hard mask etch bias further based on a default dielectric etch compensation table and a dielectric etch bias Delta CD and a default hard mask etch compensation table and a hard mask etch bias Delta CD, respectively. Further aspects include, if the top CD overlap of the via layer with the upper connecting metal layer and the bottom CD overlap of the via layer with the lower connecting metal layer or if the top CD overlap of the metal layer with the upper connecting via layer and the bottom CD overlap of the upper connecting metal layer with the via layer are not within the criteria, the apparatus being further caused to: determine whether available space on the wafer is such that a bridging limit is not violated. Additional aspects include, if the top CD overlap of the via layer with the upper connecting metal layer and the bottom CD overlap of the via layer with the lower connecting metal layer are within the criteria, if the top CD overlap of the upper connecting metal layer with the upper connecting via layer and the bottom CD overlap of the upper connecting metal layer with the via layer are within the criteria, or if the available space on the wafer is such that the bridging limit is violated, the apparatus being further caused to: output the final dielectric etch compensation table or the final hard mask compensation table, respectively. Another aspect includes, if the top CD overlap of the via layer with the upper connecting metal layer and the bottom CD overlap of the via layer with the lower connecting metal layer are not within the criteria and if the available space on the wafer is such that the bridging limit is not violated, the apparatus is further caused to: adjust the dielectric etch bias; update the dielectric etch bias Delta CD based on the adjustment; and repeat the step of compare the top CD overlap of the via layer with the upper connecting metal layer and the bottom CD overlap of the via layer with the lower connecting metal layer until the top CD overlap of the via layer with the upper connecting metal layer and the bottom CD overlap of the via layer with the lower connecting metal layer are within the criteria.

Other aspects include, if the top CD overlap of the metal layer with the upper connecting via layer and the bottom CD overlap of the metal layer with the lower connecting via layer are within the criteria and if available the space on the wafer is such that the bridging limit is not violated, the apparatus being further caused to: adjust the hard mask etch bias; update the hard mask etch bias Delta CD based on the adjustment; and repeat the step of compare the top CD overlap of the upper connecting metal layer with the upper connecting via layer and the bottom CD overlap of the upper connecting metal layer with the via layer until the top CD overlap of the upper connecting metal layer with the upper connecting via layer and the bottom CD overlap of the upper connecting metal layer with the via layer are within the criteria. Further aspects include, if final dielectric etch compensation table for the via layer and the final hard mask etch compensation table for the metal layer are outputted to the OPC process flow, the apparatus being further caused to: perform OPC on the final dielectric etch compensation table and the hard mask etch compensation table; generate GDSout files based on the OPC; and send the GDSout files to a mask house for reticle processing. Additional aspects include, if final dielectric etch compensation table for the via layer and the final hard mask etch compensation table for the metal layer are outputted to the MPC process flow, the apparatus being further caused to: generate GDSout files after OPC based on the final dielectric etch compensation table and the hard mask etch compensation table; finalize the generated GDSout files; and send the GDSout files to either an outside mask house or an internal mask house for reticle processing.

A further aspect of the present disclosure is a method including: performing an overlap pattern classification on a wafer; calibrating a dielectric etch bias based on the pattern classification, the dielectric etch bias further based on a default dielectric etch compensation table and a dielectric etch bias Delta CD; comparing a top CD overlap of a via layer with an upper connecting metal layer and a bottom CD overlap of the via layer with a lower connecting metal layer against a criteria based on the dielectric etch bias calibration; adjusting the dielectric etch bias based on the via layer comparison; updating the dielectric etch bias Delta CD based on the dielectric etch bias adjustment; repeating the steps of comparing, adjusting, and updating relative to the via layer until the top CD overlap of the via layer with the upper connecting metal layer and the bottom CD overlap of the via layer with the lower connecting metal layer are within the criteria; outputting a final dielectric etch compensation table for the via layer to either an OPC process flow or a MPC process flow based on the via layer comparison; calibrating a hard mask etch bias based on the pattern classification, the hard mask etch bias further based on a default hard mask etch compensation table and a hard mask etch bias Delta CD; comparing a top CD overlap of the upper connecting metal layer with an upper connecting via layer and a bottom CD overlap of the upper connecting metal layer with the via layer against the criteria based on the hard mask etch bias calibration; adjusting the hard mask etch bias based on the upper connecting metal layer comparison; updating the hard mask etch bias Delta CD based on the hard mask etch bias adjustment; repeating the steps of comparing, adjusting, and updating relative to the upper connecting metal layer until the top CD overlap of the upper connecting metal layer with the upper connecting via layer and the bottom CD overlap of the upper connecting metal layer with the via layer are within the criteria; and outputting a final hard mask etch compensation table for the upper connecting metal layer to either an OPC process flow or a MPC process flow based on the metal layer comparison.

Aspects of the present disclosure include, if the top CD overlap of the via layer with the upper connecting metal layer and the bottom CD overlap of the via layer with the lower connecting metal layer or if the top CD overlap of the upper connecting metal layer with the upper connecting via layer and the bottom CD overlap of the upper connecting metal layer with the via layer are not within the criteria, determining whether available space on the wafer is such that a bridging limit is not violated before adjusting the dielectric etch bias or the hard mask etch bias, respectively; and outputting the final dielectric etch compensation table or the final hard mask compensation table, respectively, if the available space on the wafer is such that the bridging limit is violated.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of being unable to accurately predict the overlap between a via layer, e.g., Vx, and an upper connecting metal layer, e.g., Mx+1, attendant upon the formation of vias in semiconductor devices.

Methodology in accordance with embodiments of the present disclosure includes performing an overlap pattern classification on a wafer. Either a dielectric etch bias or a hard mask etch bias is calibrated based on the pattern classification. Either a top CD overlap of a via layer with an upper connecting metal layer and a bottom CD overlap of the via layer with a lower connecting metal layer or a top CD overlap of the upper connecting metal layer with an upper connecting via layer and a bottom CD overlap of the upper connecting metal layer with the via layer are compared against a criteria based on the calibration. A final dielectric etch compensation table for the via layer or a final hard mask etch compensation table for the upper connecting metal layer is outputted to either an OPC process flow or a MPC process flow based on the comparison, and the steps of calibrating, comparing, and outputting are repeated for either the via layer or the upper connecting metal layer remaining.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
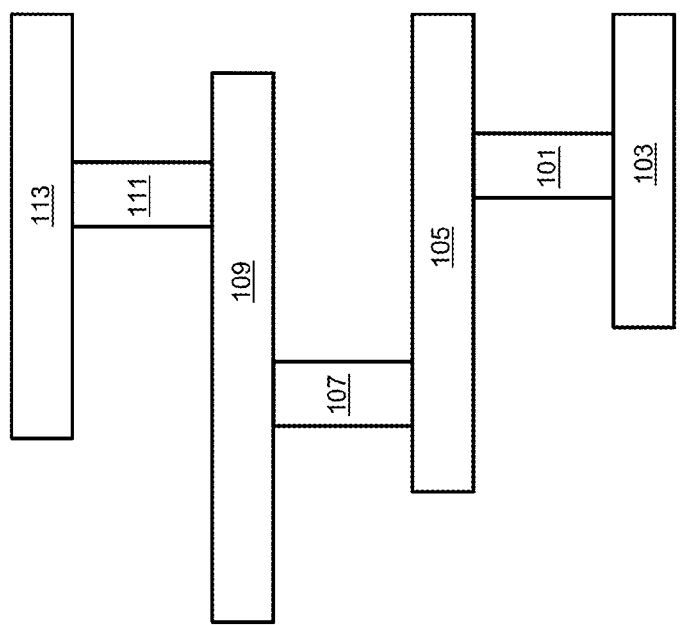
FIG. 1 schematically illustrates a background layering of Mx+1 and Vx layers.
Figure 2A:
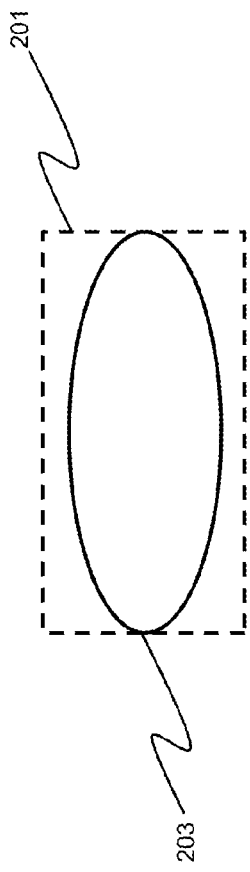
FIG. 2A schematically illustrates a background hard mask etch bias of a Mx layer.
Figure 2B:
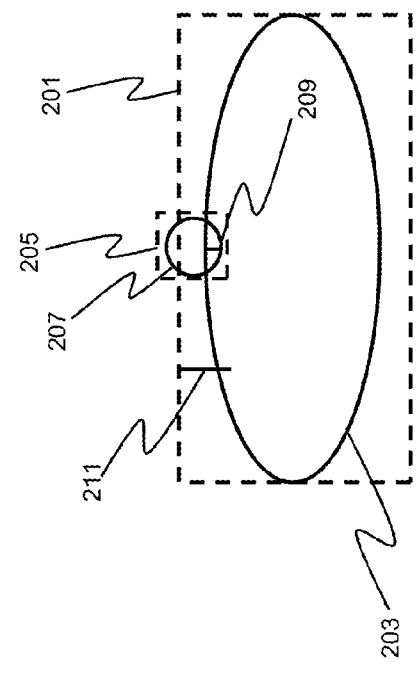
FIG. 2B schematically illustrates a background dielectric etch bias of a Vx layer and a comparison of an assumed overlap and an actual overlap of a Vx layer and a Mx+1 layer.
Figure 3:
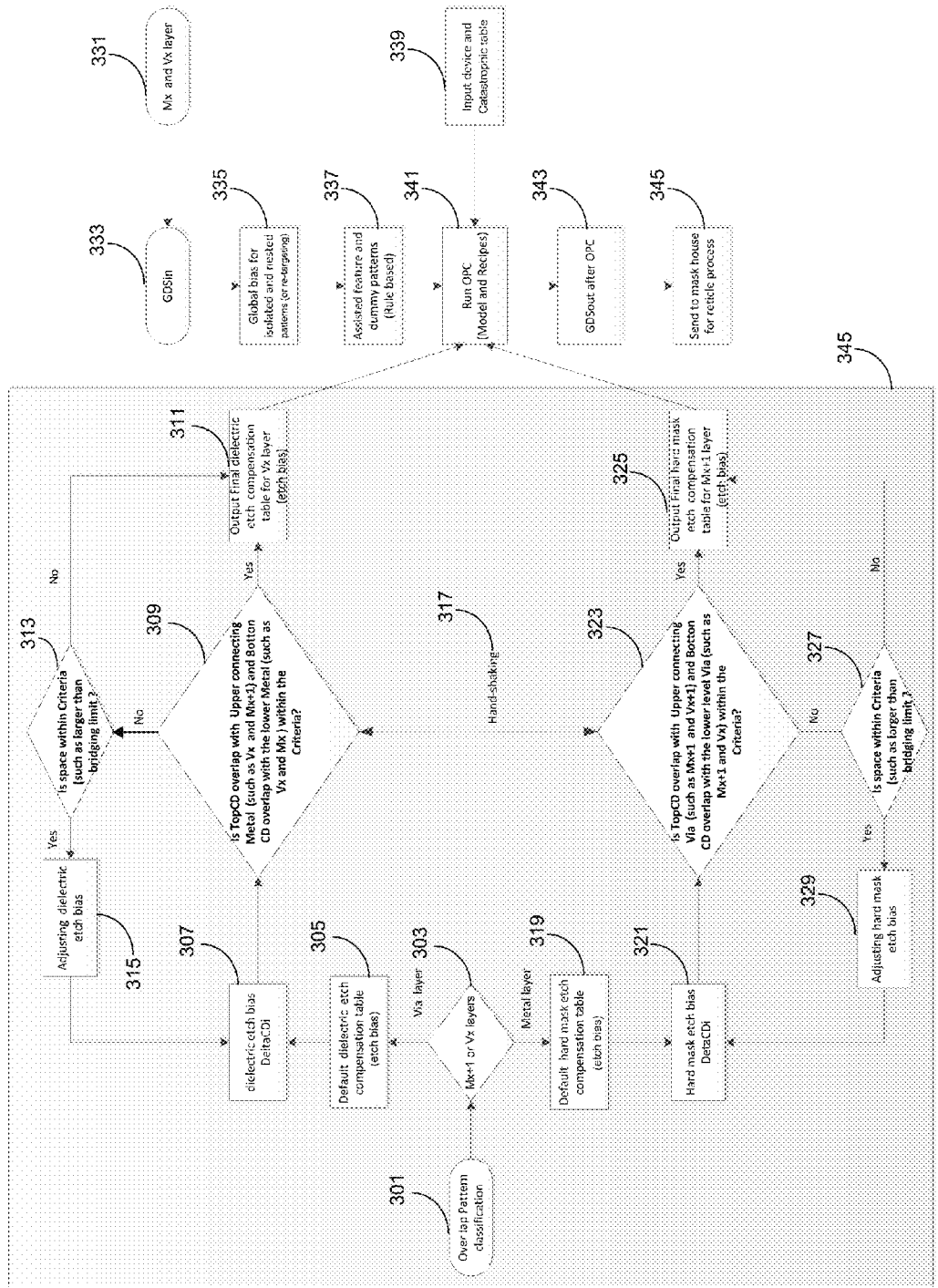
FIG. 3 schematically illustrates an OPC process flow including hard mask etch bias, dielectric etch bias, and overlap checking tables for a via layer, e.g., Vx, and an upper connecting metal layer, e.g., Mx+1, in accordance with an exemplary embodiment.

FIG. 3 depicts an OPC process flow including a hard mask etch bias, a dielectric etch bias, and overlap checking tables for a via layer (such as Vx) and upper connecting metal layer (such as Mx+1), in accordance with an exemplary embodiment. In step 301, an overlap pattern classification is performed on a wafer. For example, the pattern may be associated with a Mx+1 or a Vx layer, e.g., V0, M1, V1, M2, V2, or, M3. In step 303, the pattern is determined to correspond to either an upper connecting metal, e.g., Mx+1, or a connecting via (Vx) layer. If the pattern corresponds to a Vx layer, e.g., V1, then in step 305, a dielectric etch bias may be initially or coarsely calibrated based on a default dielectric etch compensation table (etch bias). In step 307, the dielectric etch bias may then be fine-tuned based on a dielectric etch bias Delta CD.

In step 309, a top CD overlap of the via layer, e.g., V1, with an upper connecting metal layer, e.g., M2, and a bottom CD overlap of the via layer with a lower connecting metal layer, e.g., M1, as calibrated in steps 305 and 307, are compared against a criteria to determine if the top CD overlap and the bottom CD overlap of the via layer are within the criteria. If the top CD overlap and the bottom CD overlap are not within the criteria, a smaller overlap than what was assumed will likely be generated between the via layer, e.g., V1, and the upper connecting metal layer, e.g., Mx+2, which may cause more polymer, e.g., carbon titanium fluorine ($C_xTiF_y$), to be sputtered to a via bottom, causing the via to have a higher aspect ratio. A high aspect ratio may make it more difficult to pump out by-product to clear the via for subsequent electrical connections. In contrast, if the top CD overlap and the bottom CD overlap are within the criteria, a larger overlap may be generated between the via layer, e.g., V1, and the upper connecting metal layer, e.g., Mx+2, which may cause less polymer, e.g., $C_xTiF_y$, to be sputtered to a via bottom, causing a via to have a lower aspect ratio, which in turn may make it easier to pump out by-product to clear the via for subsequent electrical connections.

In step 311, if the top CD overlap and the bottom CD overlap of the Vx layer, e.g., V1, are within the criteria, then a final dielectric etch compensation table (etch bias) for the Vx layer may be generated and outputted to an OPC process flow. In step 313, if the top CD overlap and the bottom CD overlap are not within the criteria, the wafer may be examined to determine whether there is available space on the wafer, e.g., for adjusting the dielectric etch bias, and to determine whether any such available space is larger than a bridging limit. If there is no available space or the available space is such that the bridging limit is violated, then a final dielectric etch compensation table (etch bias) for the Vx layer, e.g., V1, may be generated and outputted to an OPC process flow in step 311.

Figure 4A:
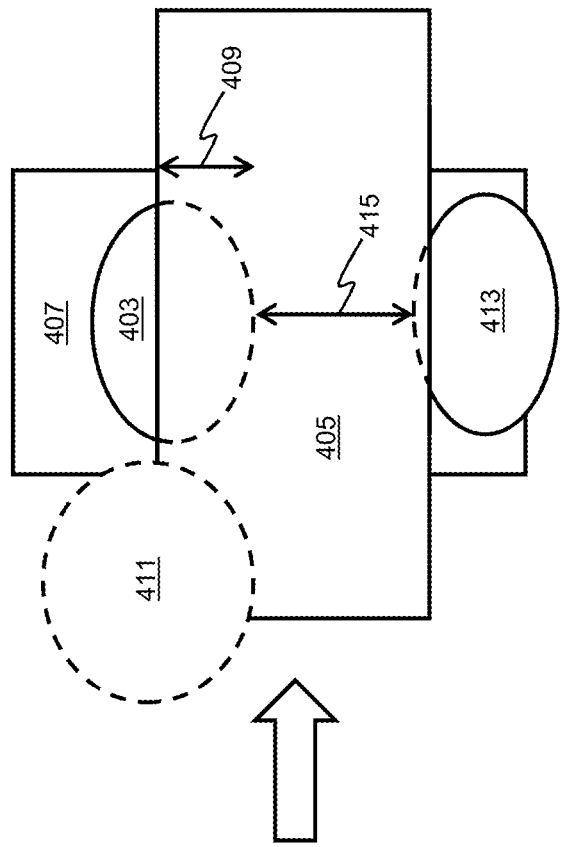
FIGS. 4A and 4B schematically illustrate example adjustments to the dielectric etch bias and the hard mask etch bias, respectively, in accordance with an exemplary embodiment.
Figure 4A:
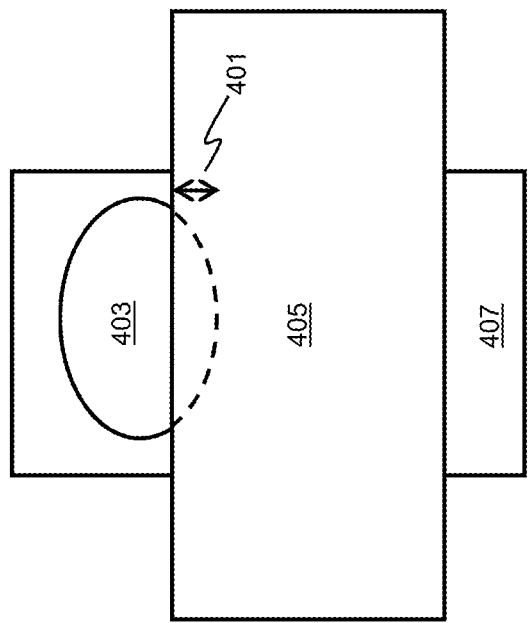

For example, adverting to FIG. 4A, the top CD overlap 401 of a via 403 with the upper connecting metal layer 405 and the bottom CD overlap of the via 403 with the lower connecting metal layer 407 are compared against the criteria. In this example, the top CD overlap 401 is determined not to be within the criteria. In step 315, if there is available space and the space is such that the bridging limit is not violated, then the dielectric etch bias may be adjusted. The dielectric etch bias may be adjusted, for example, by moving or shifting the via layer, e.g., V1, as depicted by the arrow 409 or by enlarging the vias of the via layer as depicted by the dashed circle 411. In this example, there is available space between the shifted via 403 and the via 413 as depicted by the arrow 415 and the available space is determined to be such that the bridging limit is not violated. The coverage of both connecting metal layers, e.g., M1 and M2, by the via layer, e.g., V1, must be considered with respect to adjusting the dielectric etch bias.

Once the dielectric etch bias is adjusted in step 315, the dielectric etch bias Delta CD of step 307 may be updated and the comparison step 309 may be repeated until the top CD overlap of the via layer, e.g., V1, with the upper connecting metal layer, e.g., M2, and the bottom CD overlap of the via layer with the lower connecting metal layer, e.g., M1, are within the criteria. Once, the top CD overlap and the bottom CD overlap are within the criteria, then a final dielectric etch compensation table (etch bias) for the Vx layer, e.g., V1, may be generated and outputted to an OPC process flow in step 311. Because of the relationship between Mx and connecting Vx layers, wafer overhead, and/or device related design rules, the Mx and connecting Vx layers are adjusted in relation to one another, as depicted by the "handshaking" step 317. Therefore, although the dielectric etch bias for the via layer may be properly calibrated at this stage of the process flow, an OPC process is not run yet.

In step 319, a hard mask etch bias may be initially or coarsely calibrated based on a default hard mask etch compensation table (etch bias). In step 321, the hard mask bias may then be fine-tuned based on a hard mask etch bias Delta CD. In step 323, a top CD overlap of the upper connecting metal layer, e.g., M2, with an upper connecting via layer, e.g., V2, and a bottom CD overlap of the upper connecting metal layer, e.g., M2, with a lower connecting via layer, e.g., V1, as calibrated in steps 319 and 321, are compared against a criteria to determine if the top CD overlap and the bottom CD overlap are within the criteria. If the top CD overlap and the bottom CD overlap of the Mx+1 layer are not within the criteria, a smaller overlap than what was assumed will likely be generated between the Vx, Mx+1, and Vx+1 layers, e.g., V1, M2, and V2, respectively, minimizing the connection area between the vias and the connecting metal layer.

In step 325, if the top CD overlap and the bottom CD overlap corresponding to the Mx+1 layer, e.g., M2, are within the criteria, then a final hard mask etch compensation table (etch bias) for the Mx+1 layer may be generated and outputted to the OPC process flow. In step 327, if the top CD overlap and the bottom CD overlap are not within the criteria, the wafer may be examined to determine whether there is available space on the wafer, e.g., for adjusting the hard mask etch bias, and to determine whether any such available space is larger than a bridging limit. If there is no available space or the available space is such that the bridging limit is violated, then a final hard mask etch compensation table (etch bias) for the Mx+1 layer, e.g., M2, may be generated and outputted to the OPC process flow in step 325.

Figure 4B:
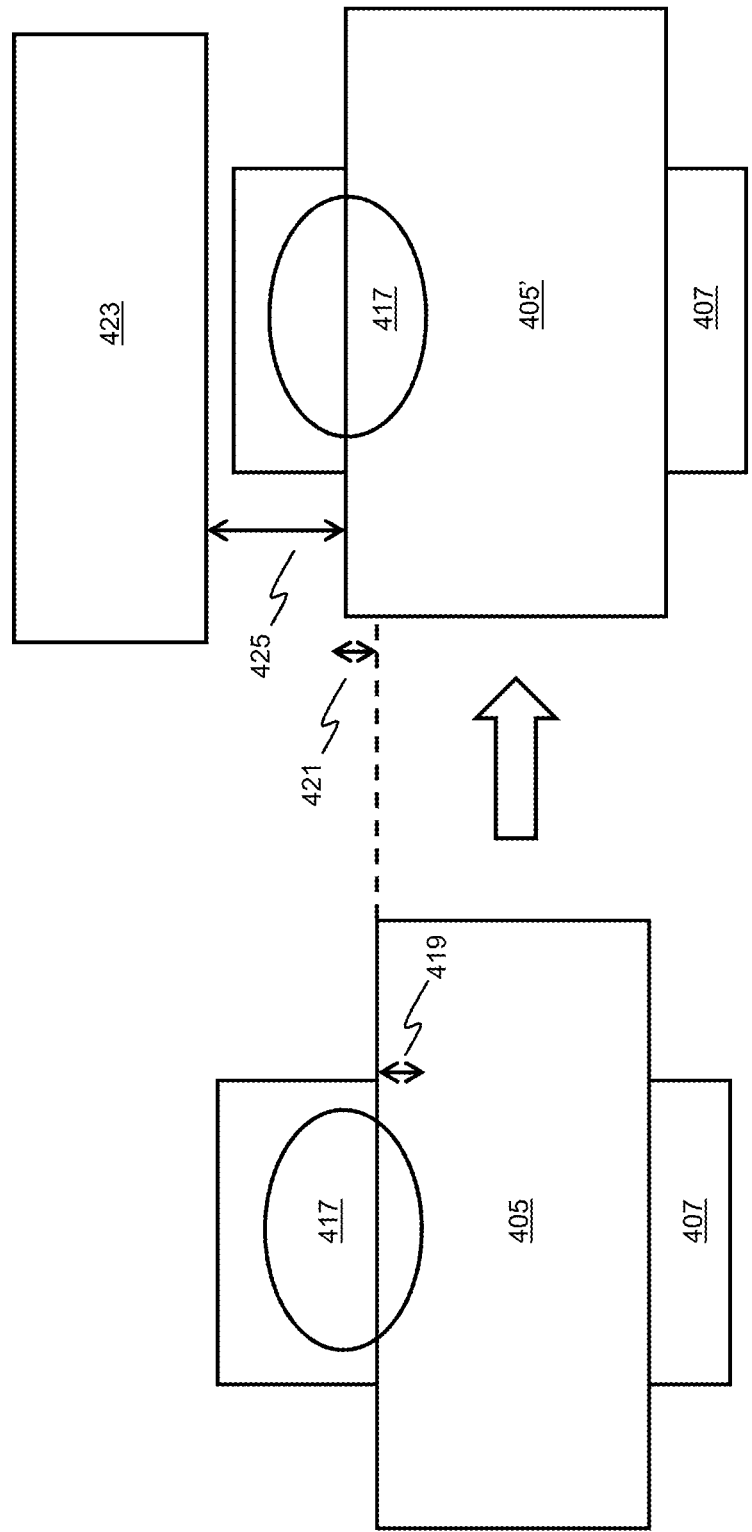

For example, adverting to FIG. 4B, a top CD overlap of the upper connecting metal layer 405, e.g., M2, with an upper connecting via layer 417, e.g., V2, and a bottom CD overlap of the upper connecting metal layer 405, e.g., M2, with a lower connecting via layer (not shown for illustrative convenience), e.g., V1, as calibrated in steps 319 and 321, are compared against the criteria. In this example, the top CD overlap 419 is determined to be not within the criteria. In step 327, if there is available space and the space is such that the bridging limit is not violated, then the hard mask etch bias may be adjusted. In contrast to the dielectric etch bias, the hard mask etch bias may only be adjusted by enlarging the layer as depicted by the arrow 421 and not by shifting the layer. In this example, there is available space between the enlarged upper connecting metal layer 405' and the upper connecting metal layer 423 as depicted by the arrow 425 and the available space is determined to be such that the bridging limit is not violated. The coverage of the connecting Vx layers, e.g., V1 and V2, must be considered with respect to adjusting the hard mask etch bias. Once the hard mask bias is adjusted in step 327, the hard mask bias Delta CD of step 321 may be updated and the comparison step 323 may be repeated until the top CD overlap of the upper connecting metal layer, e.g., M2, with the upper connecting via layer, e.g., V2, and a bottom CD overlap of the upper connecting metal layer with the lower connecting via layer, e.g., V1, are within the criteria. Once the top CD overlap and the bottom CD overlap of the Mx+1 layer, e.g., M2, are within the criteria, then a final hard mask etch compensation table (etch bias) for the Mx+1 layer, e.g., M2, may be generated and outputted to the OPC process flow in step 325.

In step 331, Mx and Vx layer layouts and/or artwork files may be entered into a GDS system forming GDS in (GDSin) files in step 333. In step 335, the GDSin files may enable global bias for isolation and nested patterns (or re-targeting). In step 337, assisted features and dummy patterns (rules based) may be generated. In step 339, input device and catastrophic table data may be entered into the OPC process flow. In step 341, the OPC process is run using the final dielectric etch compensation table of step 311 for the Vx layer, e.g., V1, and the final hard mask etch compensation table of step 325 for the Mx+1 layer, e.g., M2. Once the OPC of step 341 is complete, the GDSout files may be generated in step 343 and sent to a mask house for reticle processing in step 345. The steps 331 through 343 outside of the box 345 are known in the art.

Figure 5:
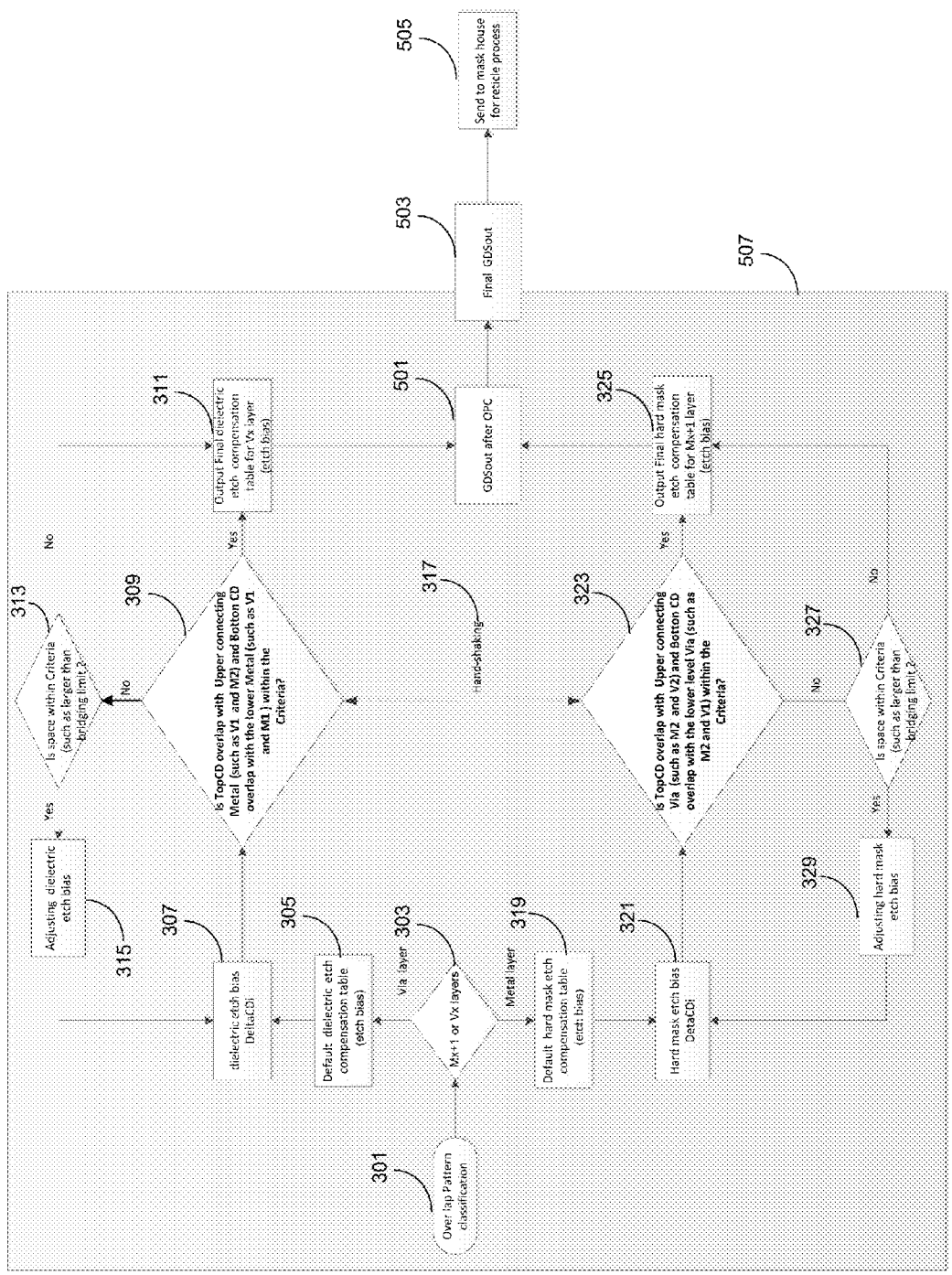
FIG. 5 schematically illustrates a MPC process flow including hard mask etch bias, dielectric etch bias, and overlap checking tables for a via layer, e.g., Vx, and an upper connecting metal layer, e.g., Mx+1, for reticle processing by either a third-party mask house or an in-house mask house, in accordance with an exemplary embodiment.

FIG. 5 depicts a MPC process flow including hard mask etch bias, dielectric etch bias, and overlap checking tables for Vx and Mx+1 layers for reticle processing by either a third-party mask house or an in-house mask house, in accordance with an exemplary embodiment. The steps 301 through 325 of FIG. 3 are repeated with respect to FIG. 5. However, in step 501, GDSout files (after OPC) are generated based on the final etch compensation table of step 311 for the Vx layer, e.g., V1, and the final hard mask etch compensation table of step 325 for the Mx+1 layer, e.g., M2. The generated GDSout files of step 501 may then be finalized or polished in step 503 and sent to either an outside or third-party mask house or an internal or in-house mask house for reticle processing in step 505. The steps 503 and 505 outside of the box 507 are known in the art.

The embodiments of the present disclosure can achieve several technical effects including overlap pattern classification to generate the bias compensation required to maximize the connection area between vias and connecting metal layers; outputting a final hard mask etch compensation table to OPC or MPC process flows; outputting a final dielectric etch compensation table to OPC or MPC process flows; and increasing the overlap between vias and connecting metal layers. Embodiments of the present disclosure enjoy utility in various industrial applications as, for example, microprocessors, smart phones, mobile phones, cellular handsets, set-top boxes, DVD recorders and players, gaming systems, and digital cameras. The present disclosure therefore enjoys industrial applicability in any of various types of highly integrated semiconductor devices including vias.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    performing an overlap pattern classification on a wafer;
    calibrating either a dielectric etch bias or a hard mask etch bias based on the pattern classification;
    comparing either a top critical dimension (CD) overlap of a via layer with an upper connecting metal layer and a bottom CD overlap of the via layer with a lower connecting metal layer or a top CD overlap of the upper connecting metal layer with an upper connecting via layer and a bottom CD overlap of the upper connecting metal layer with the via layer against a criteria based on the calibration;
    outputting a final dielectric etch compensation table for the via layer or a final hard mask etch compensation table for the upper connecting metal layer to either an optical proximity correction (OPC) process flow or a mask process correction (MPC) process flow based on the comparison; and
    repeating the steps of calibrating, comparing, and outputting for either the via layer or the upper metal layer remaining.

2. The method according to claim 1, comprising performing the steps of comparing the top CD overlap of the via layer with the upper connecting metal layer and the bottom CD overlap of the via layer with the lower connecting metal layer and the top CD overlap of the upper connecting metal layer with the upper connecting via layer and the bottom CD overlap of the upper connecting metal layer with the via layer against the criteria in relation to one another.

3. The method according to claim 1, comprising calibrating the dielectric etch bias or the hard mask etch bias further based on a default dielectric etch compensation table and a dielectric etch bias Delta CD and a default hard mask etch compensation table and a hard mask etch bias Delta CD, respectively.

4. The method according to claim 1, wherein if the top CD overlap of the via layer with the upper connecting metal layer and the bottom CD overlap of the via layer with the lower connecting metal layer or if the top CD overlap of the upper connecting metal layer with the upper connecting via layer and the bottom CD overlap of the upper connecting metal layer with the via layer are not within the criteria, the method further comprises:
    determining whether available space on the wafer is such that a bridging limit is not violated.

5. The method according to claim 4, wherein if the top CD overlap of the via layer with the upper connecting metal layer and the bottom CD overlap of the via layer with the lower connecting metal layer are within the criteria, if the top CD overlap of the upper connecting metal layer with the upper connecting via layer and the bottom CD overlap of the upper connecting metal layer with the via layer are within the criteria, or if the available space on the wafer is such that the bridging limit is violated, the method further comprises:
    outputting the final dielectric etch compensation table or the final hard mask compensation table, respectively.

6. The method according to claim 4, wherein if the top CD overlap of the via layer with the upper connecting metal layer and the bottom CD overlap of the via layer with the lower connecting metal layer are not within the criteria and if the available space on the wafer is such that the bridging limit is not violated, the method further comprises:
    adjusting the dielectric etch bias;
    updating the dielectric etch bias Delta CD based on the adjustment; and
    repeating the step of comparing the top CD overlap of the via layer with the upper connecting metal layer and the bottom CD overlap of the via layer with the lower connecting metal layer until the top CD overlap of the via layer with the upper connecting metal layer and the bottom CD overlap of the via layer with the lower connecting metal layer are within the criteria.

7. The method according to claim 4, wherein if the top CD overlap of the upper connecting metal layer with the upper connecting via layer and the bottom CD overlap of the upper connecting metal layer with the lower connecting via layer are within the criteria and if the available space on the wafer is such that the bridging limit is not violated, the method further comprises:
adjusting the hard mask etch bias;
updating the hard mask etch bias Delta CD based on the adjustment; and
repeating the step of comparing the top CD overlap of the upper connecting metal layer with the upper connecting via layer and the bottom CD overlap of the upper connecting metal layer with the lower connecting via layer until the top CD overlap of the upper connecting metal layer with the upper connecting via layer and the bottom CD overlap of the upper connecting metal layer with the via layer are within the criteria.

8. The method according to claim 1, wherein if final dielectric etch compensation table for the via layer and the final hard mask etch compensation table for the upper connecting metal layer are outputted to the OPC process flow, the method further comprising:
performing OPC on the final dielectric etch compensation table and the hard mask etch compensation table;
generating graphic data system out (GDSout) files based on the OPC; and
sending the GDSout files to a mask house for reticle processing.

9. The method according to claim 1, wherein if final dielectric etch compensation table for the via layer and the final hard mask etch compensation table for the upper connecting metal layer are outputted to the MPC process flow, the method further comprising:
generating GDSout files after OPC based on the final dielectric etch compensation table and the hard mask etch compensation table;
finalizing the generated GDSout files; and
sending the GDSout files to either an outside mask house or an internal mask house for reticle processing.

10. An apparatus comprising:
a processor; and
a memory including computer program code for one or more programs, the memory and the computer program code configured to, with the processor, cause the apparatus to perform the following,
perform an overlap pattern classification on a wafer;
calibrate either a dielectric etch bias or a hard mask etch bias based on the pattern classification;
compare either a top critical dimension (CD) overlap of a via layer with an upper connecting metal layer and a bottom CD overlap of the via layer with a lower connecting metal layer or a top CD overlap of the upper connecting metal layer with an upper connecting via layer and a bottom CD overlap of the upper connecting metal layer with the via layer against a criteria based on the calibration;
output a final dielectric etch compensation table for the via layer or a final hard mask etch compensation table for the upper connecting metal layer to either an optical proximity correction (OPC) process flow or a mask process correction (MPC) process flow based on the comparison; and repeat the steps of calibrate, compare, and output for either the via layer or the upper connecting metal layer remaining.

11. The apparatus according to claim 10, wherein the apparatus is further caused to:
perform the steps of comparing the top CD overlap of the via layer with the upper connecting metal layer and the bottom CD overlap of the via layer with the lower connecting metal layer and the top CD overlap of the upper connecting metal layer with the upper connecting via layer and the bottom CD overlap of the upper connecting metal layer with the via layer against the criteria in relation to one another.

12. The apparatus according to claim 10, wherein the apparatus is further caused to:
calibrate the dielectric etch bias or the hard mask etch bias further based on a default dielectric etch compensation table and a dielectric etch bias Delta CD and a default hard mask etch compensation table and a hard mask etch bias Delta CD, respectively.

13. The apparatus according to claim 10, wherein if the top CD overlap of the via layer with the upper connecting metal layer and the bottom CD overlap of the via layer with the lower connecting metal layer or if the top CD overlap of the upper connecting metal layer with the upper connecting via layer and the bottom CD overlap of the upper connecting metal layer with the via layer are not within the criteria, the apparatus is further caused to:
determine whether available space on the wafer is such that a bridging limit is not violated.

14. The apparatus according to claim 13, wherein if the top CD overlap of the via layer with the upper connecting metal layer and the bottom CD overlap of the via layer with the lower connecting metal layer are within the criteria, if the top CD overlap of the upper connecting metal layer with the upper connecting via layer and the bottom CD overlap of the upper connecting metal layer with the via layer are within the criteria, or if the available space on the wafer is such that the bridging limit is violated, the apparatus is further caused to:
output the final dielectric etch compensation table or the final hard mask compensation table, respectively.

15. The apparatus according to claim 14, wherein if the top CD overlap of the via layer with the upper connecting metal layer and the bottom CD overlap of the via layer with the lower connecting metal layer are not within the criteria and if the available space on the wafer is such that the bridging limit is not violated, the apparatus is further caused to:
adjust the dielectric etch bias;
update the dielectric etch bias Delta CD based on the adjustment; and
repeat the step of compare the top CD overlap of the via layer with the upper connecting metal layer and the bottom CD overlap of the via layer with the lower connecting metal layer until the top CD overlap of the via layer with the upper connecting metal layer and the bottom CD overlap of the via layer with the lower connecting metal layer are within the criteria.

16. The apparatus according to claim 14, wherein if the top CD overlap of the upper connecting metal layer with the upper connecting via layer and the bottom CD overlap of the upper connecting metal layer with the via layer are within the criteria and if available the space on the wafer is such that the bridging limit is not violated, the apparatus is further caused to:
adjust the hard mask etch bias;

update the hard mask etch bias Delta CD based on the adjustment; and repeat the step of compare the top CD overlap of the upper connecting metal layer with the upper connecting via layer and the bottom CD overlap of the upper connecting metal layer with the via layer until the top CD overlap of the upper connecting metal layer with the upper connecting via layer and the bottom CD overlap of the upper connecting metal layer with the via layer are within the criteria.

17. The apparatus according to claim 10, wherein if final dielectric etch compensation table for the via layer and the final hard mask etch compensation table for the upper connecting metal layer are outputted to the OPC process flow, the apparatus is further caused to:

perform OPC on the final dielectric etch compensation table and the hard mask etch compensation table;

generate graphic data system out (GDSout) files based on the OPC; and send the GDSout files to a mask house for reticle processing.

18. The apparatus according to claim 10, wherein if final dielectric etch compensation table for the via layer and the final hard mask etch compensation table for the upper connecting metal layer are outputted to the MPC process flow, the apparatus is further caused to:

generate GDSout files after OPC based on the final dielectric etch compensation table and the hard mask etch compensation table;

finalize the generated GDSout files; and send the GDSout files to either an outside mask house or an internal mask house for reticle processing.

19. A method comprising:

performing an overlap pattern classification on a wafer;

calibrating a dielectric etch bias based on the pattern classification, the dielectric etch bias further based on a default dielectric etch compensation table and a dielectric etch bias Delta critical dimension (CD);

comparing a top CD overlap of a via layer with an upper connecting metal layer and a bottom CD overlap of the via layer with a lower connecting metal layer against a criteria based on the dielectric etch bias calibration;

adjusting the dielectric etch bias based on the via layer comparison;

updating the dielectric etch bias Delta CD based on the dielectric etch bias adjustment;

repeating the steps of comparing, adjusting, and updating relative to the via layer until the top CD overlap of the via layer with the upper connecting metal layer and the bottom CD overlap of the via layer with the lower connecting metal layer are within the criteria;

outputting a final dielectric etch compensation table for the via layer to either an optical proximity correction (OPC) process flow or a mask process correction (MPC) process flow based on the via layer comparison;

calibrating a hard mask etch bias based on the pattern classification, the hard mask etch bias further based on a default hard mask etch compensation table and a hard mask etch bias Delta CD;

comparing a top CD overlap of the upper connecting metal layer with an upper connecting via layer and a bottom CD overlap of the upper connecting metal layer with the via layer against the criteria based on the hard mask etch bias calibration;

adjusting the hard mask etch bias based on the upper connecting metal layer comparison;

updating the hard mask etch bias Delta CD based on the hard mask etch bias adjustment;

repeating the steps of comparing, adjusting, and updating relative to the upper connecting metal layer until the top CD overlap of the upper connecting metal layer with the upper connecting via layer and the bottom CD overlap of the upper connecting metal layer with the via layer are within the criteria; and outputting a final hard mask etch compensation table for the upper connecting metal layer to either an OPC process flow or a MPC process flow based on the metal layer comparison.

20. The method according to claim 19, wherein if the top CD overlap of the via layer with the upper connecting metal layer and the bottom CD overlap of the via layer with the lower connecting metal layer or if the top CD overlap of the upper connecting metal layer with the upper connecting via layer and the bottom CD overlap of the upper connecting metal layer with the via layer are not within the criteria, the method further comprises:

determining whether available space on the wafer is such that a bridging limit is not violated before adjusting the dielectric etch bias and/or the hard mask etch bias, respectively; and outputting the final dielectric etch compensation table or the final hard mask compensation table, respectively, if the available space on the wafer is such that the bridging limit is violated.

* * * * *